(12) United States Patent
Park et al.

(10) Patent No.: US 10,388,661 B2
(45) Date of Patent: Aug. 20, 2019

(54) SEMICONDUCTOR DEVICE AND METHOD OF MANUFACTURING THE SAME

(71) Applicant: SK hynix Inc., Icheon-si Gyeonggi-do (KR)

(72) Inventors: Min Woo Park, Seoul (KR); Kyo Yeon Cho, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/682,003

(22) Filed: Aug. 21, 2017

(65) Prior Publication Data

US 2018/0175053 A1 Jun. 21, 2018

(30) Foreign Application Priority Data

Dec. 19, 2016 (KR) .................. 10-2016-0173706

(51) Int. Cl.
*H01L 27/11556* (2017.01)
*H01L 27/11582* (2017.01)

(52) U.S. Cl.
CPC .. *H01L 27/11582* (2013.01); *H01L 27/11556* (2013.01)

(58) Field of Classification Search
None
See application file for complete search history.

(56) References Cited

U.S. PATENT DOCUMENTS

2014/0070302 A1* 3/2014 Yoo ............... H01L 27/1157
257/324
2016/0172370 A1* 6/2016 Makala .......... H01L 27/11582
257/314
2016/0268277 A1* 9/2016 Nagashima ..... H01L 27/11556

FOREIGN PATENT DOCUMENTS

| KR | 1020150113265 A | 10/2015 |
| KR | 1020160049159 A | 5/2016 |
| KR | 1020160060850 A | 5/2016 |

* cited by examiner

*Primary Examiner* — Charles D Garber
*Assistant Examiner* — Xiaoming Liu
(74) *Attorney, Agent, or Firm* — William Park & Associates Ltd.

(57) ABSTRACT

Provided herein may be a semiconductor device and a method of manufacturing the same. The method of manufacturing the semiconductor device may include forming a tunnel insulating layer in a channel hole passing through a preliminary stack structure in which interlayer insulating layers and material layers are alternately stacked. The method may include forming recess areas by removing the material layers exposed through a slit passing through the preliminary stack structure. The method may include forming a data storage layer in the recess areas through the slit. The thickness of the data storage layer may be formed regardless of a size of the channel hole.

8 Claims, 26 Drawing Sheets

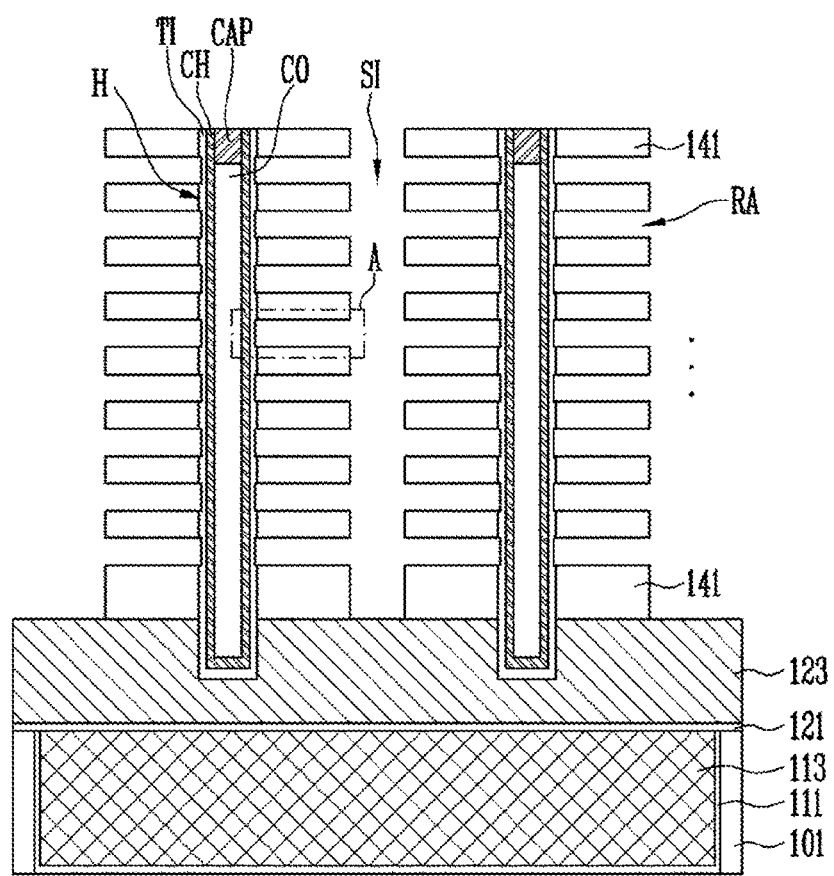

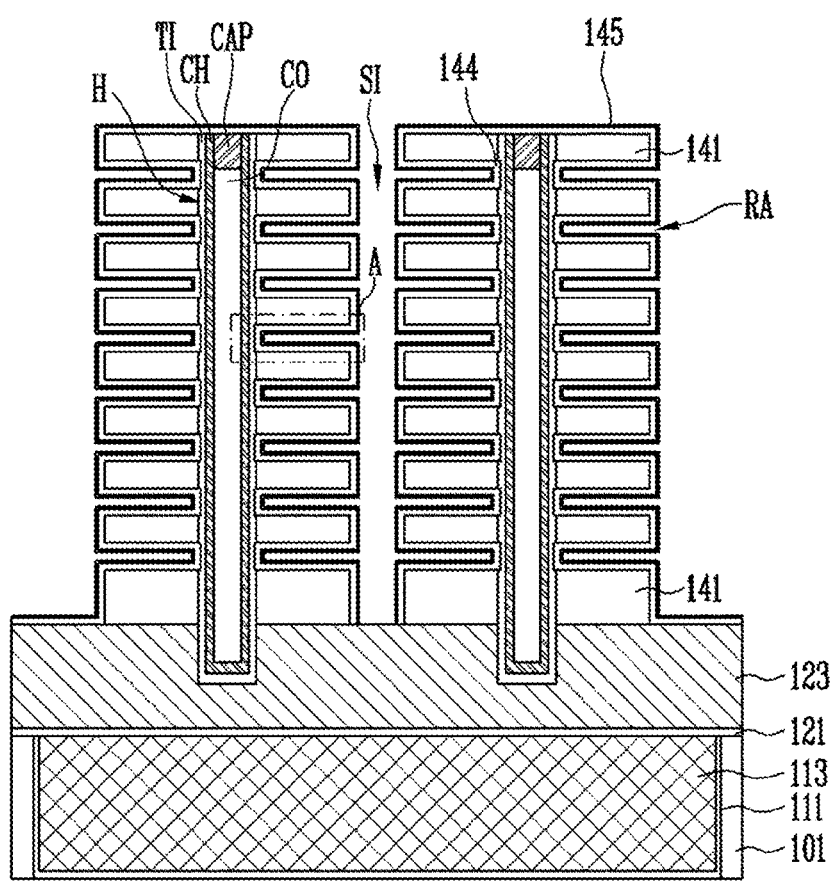

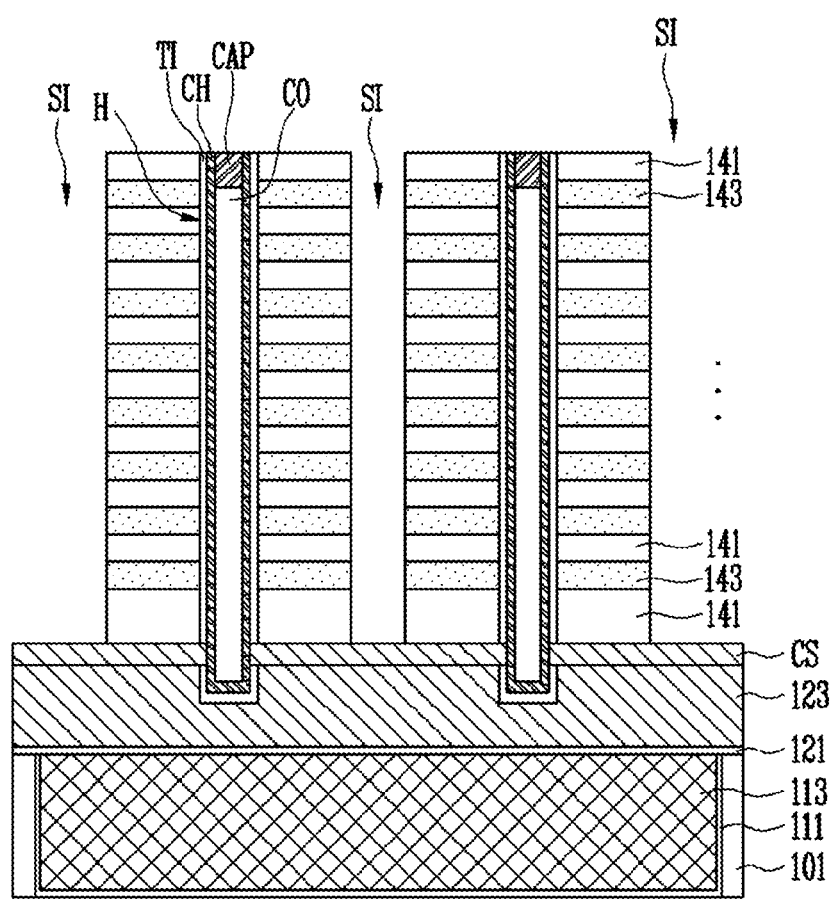

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2016-0173706 filed on Dec. 19, 2016 in the Korean Intellectual Property Office, the entire disclosure of which is incorporated herein by reference.

BACKGROUND

1. Technical Field

Various embodiments of the present disclosure may generally relate to a semiconductor device and a method of manufacturing the same, and more particularly, to a semiconductor device relating to the enhancement of the reliability of the device, and a method of manufacturing the same

2. Related Art

Semiconductor memory devices consist of a plurality of memory cells which are configured to store data. To provide for the high integration of the semiconductor memory devices, the memory cells of the semiconductor memory devices may be arranged in three dimensions.

A three-dimensional semiconductor memory device in which memory cells are arranged in three dimensions consists of interlayer insulating layers and word lines which are alternately stacked, and a channel layer formed in a channel hole passing through the interlayer insulating layers and the word lines. Memory cells are stacked along the channel layer. A memory layer consisting of at least one of a tunnel insulating layer, a data storage layer and a blocking insulating layer is formed to enclose the channel layer.

The thickness of the tunnel insulating layer or the data storage layer is a parameter which greatly influences the reliability of the device. The reason for this is because the thickness affects charge retention characteristics. Therefore, with regard to a process of manufacturing the semiconductor memory devices, there have been various proposed techniques in an effort to increase the thickness of the tunnel insulating layer or the data storage layer.

SUMMARY

An embodiment of the present disclosure may provide for a method of manufacturing a semiconductor device. The method may include forming a tunnel insulating layer in a channel hole passing through a preliminary stack structure in which interlayer insulating layers and material layers are alternately stacked. The method may include forming recess areas by removing the material layers exposed through a slit passing through the preliminary stack structure. The method may include forming a data storage layer in the recess areas through the slit. The method may include partially removing the data storage layer through the slit such that a data storage pattern remains on a sidewall of each of the recess areas adjacent to the tunnel insulating layer. The method may include forming a blocking insulating layer on the data storage pattern through the slit.

An embodiment of the present disclosure may provide for a method of manufacturing a semiconductor device. The method of manufacturing the semiconductor device may include forming a tunnel insulating layer in a channel hole passing through a preliminary stack structure in which interlayer insulating layers and material layers are alternately stacked. The method may include forming recess areas by removing the material layers exposed through a slit passing through the preliminary stack structure. The method may include forming a data storage layer in the recess areas through the slit. The thickness of the data storage layer may be formed regardless of a size of the channel hole.

An embodiment of the present disclosure may provide for a semiconductor device. The semiconductor device may include a tunnel insulating layer configured to enclose a channel layer. The semiconductor device may include interlayer insulating layers stacked and configured to enclose the tunnel insulating layer. The semiconductor device may include data storage layers disposed in respective spaces between the interlayer insulating layers and configured to enclose the tunnel insulating layer, each of the data storage layers being disposed in one side of the corresponding space adjacent to the tunnel insulating layer. The semiconductor device may include conductive patterns surrounding the tunnel insulating layer with the data storage layers interposed therebetween and fill the spaces. Each of the data storage layers may include a depression which is concave toward the channel layer.

An embodiment of the present disclosure may provide for a semiconductor device. The semiconductor device may include a channel hole including a tunnel insulating layer configured to enclose a channel layer. The semiconductor device may include interlayer insulating layers stacked and configured to enclose the tunnel insulating layer. The semiconductor device may include data storage layers disposed in respective spaces between the interlayer insulating layers and configured to enclose the tunnel insulating layer, each of the data storage layers being disposed in one side of the corresponding space adjacent to the tunnel insulating layer. The semiconductor device may include conductive patterns surrounding the tunnel insulating layer with the data storage layers interposed therebetween and fill the spaces. The data storage layer may have a thickness regardless of a size of the channel hole.

BRIEF DESCRIPTION OF THE DRAWINGS

FIGS. 4A to 4C are sectional views illustrating a method of manufacturing a semiconductor device in accordance with an embodiment of the present disclosure.

DETAILED DESCRIPTION

Figure 1A:
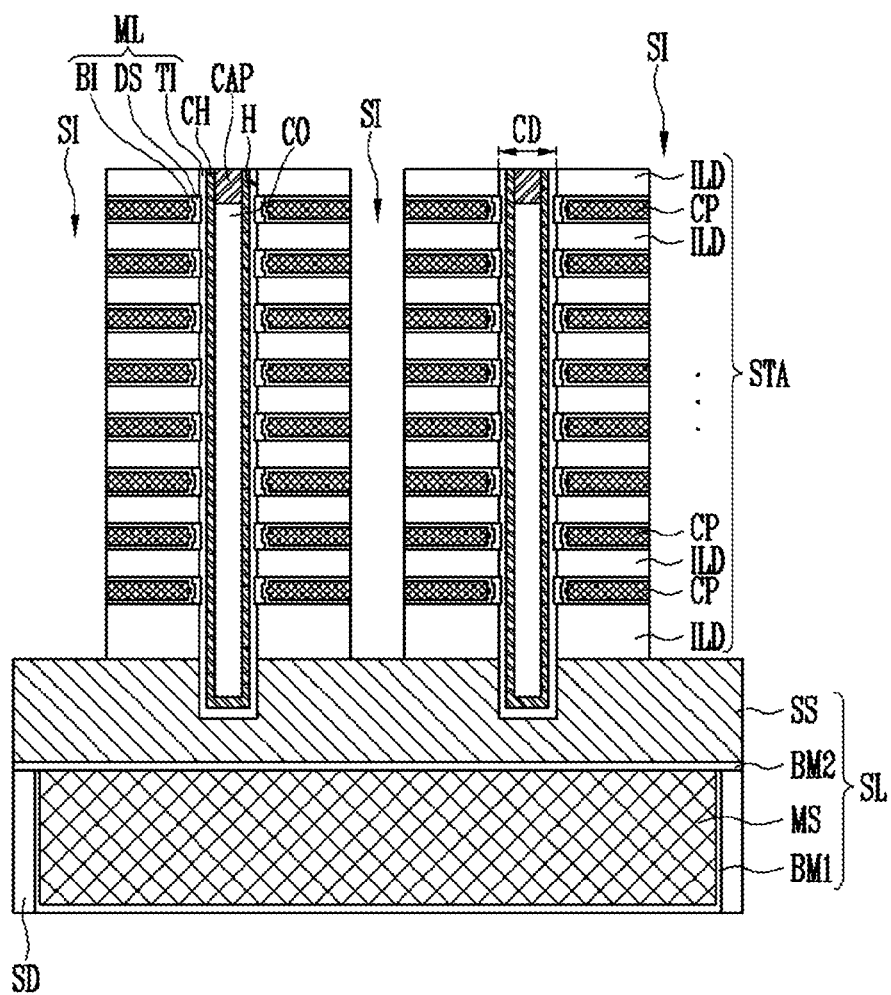
FIGS. 1A and 1B are sectional views illustrating a semiconductor device in accordance with embodiments of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor memory device capable of enhancing the reliability of the device, and a method of manufacturing the same.

Figure 1B:
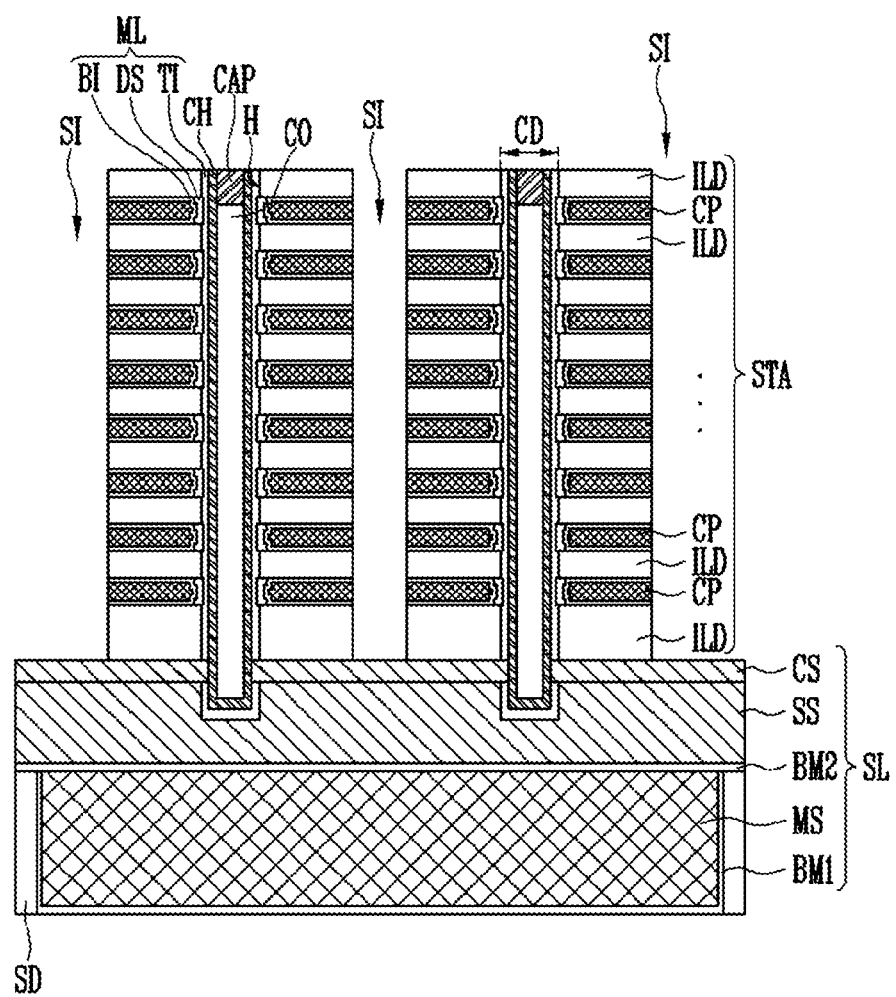

FIGS. 1A and 1B are sectional views illustrating a semiconductor device in accordance with embodiments of the present disclosure.

Referring to FIGS. 1A and 1B, the semiconductor device in accordance with an embodiment of the present disclosure may include a multilayer source layer SL, a stack structure STA and channel layers CH. Although not illustrated in the drawing, drive transistors which form a circuit for driving a memory string of the semiconductor device may be disposed under the multilayer source layer SL of the semiconductor device in accordance with an embodiment of the present disclosure. Some of the drive transistors and the multilayer source layer SL may be electrically coupled with each other through a routing line or a contact plug which is disposed therebetween.

The multilayer source layer SL may include an upper source layer SS.

The upper source layer SS may include silicon. Furthermore, the upper source layer SS may include an n-type or p-type impurity. The upper source layer SS may be formed of poly silicon having a high etching selectivity relative to oxide. Therefore, the upper source layer SS may function as an etch stop layer during an operation of forming a slit SI which will be described later herein.

The multilayer source layer SL may include a lower source layer MS. The lower source layer MS may be formed of material having a resistance lower than that of the upper source layer SS. For example, the lower source layer MS may include tungsten.

The lower source layer MS may be penetrated by a source insulating layer SD and be separated from a lower source layer (not illustrated) adjacent thereto.

A first barrier metal layer BM1 may be further formed between a sidewall of the source insulating layer SD and a sidewall of the lower source layer MS and along the bottom of the lower source layer MS. That is, the first barrier metal layer BM1 may enclose the sidewall and the bottom of the lower source layer MS. A second barrier metal layer BM2 may be further formed between the upper source layer SS and the lower source layer MS.

The stack structure STA is disposed on the multilayer source layer SL. The stack structure STA includes interlayer insulating layers ILD and conductive patterns CP which are alternately stacked. The conductive patterns CP may be used as gate electrodes of select transistors and memory cells. The interlayer insulating layers ILD may function to insulate the conductive patterns CP from each other. Each conductive pattern CP may include at least one of polysilicon, metal and metal silicide. Each interlayer insulating layer ILD may include oxide.

The slits SI may pass through the stack structure STA.

Each of the channel layers CH is disposed in a channel hole H which passes through the stack structure STA and extends into the upper source layer SS. Each of the channel layers CH may have a tubular shape, enclosing a core insulating layer CO. For example, the height of the core insulating layer CO may be less than that of the channel layers CH. A capping layer CAP may be further formed in an upper end of the core insulating layer CO. The capping layer CAP may be enclosed by an upper end of the associated channel layer CH. The channel layers CH and the capping layer CAP may be formed of semiconductor material. The capping layer CAP may include an impurity having a high concentration compared to that of the channel layers CH. Although not illustrated in the drawing, the capping layer CAP and the core insulating layer CO may not be formed. In this case, each of the channel layers CH may be formed in an embedded form in which the channel hole is completely filled therewith. Each of the channel layers CH may be used as a channel of a memory string. Each slit SI may be disposed between corresponding adjacent channel layers CH.

The multilayer source layer SL may further include a contact source layer CS as shown in FIG. 1B.

An outer surface of each of the channel layers CH may be enclosed by a multilayer layer ML. The multilayer layer ML may include a tunnel insulating layer TI which encloses the outer surface of the channel layer CH, a data storage layer DS which encloses the tunnel insulating layer TI, and a blocking insulating layer BI which encloses the data storage layer DS. The data storage layer may include silicon, nitride capable of trapping charges, phase-change material, nanodots, etc. The tunnel insulating layer may include a silicon oxide layer capable of tunneling. The blocking insulating layer may include an oxide layer capable of blocking charges.

According to an embodiment of the present disclosure, the tunnel insulating layer TI encloses an outer surface of the channel layer CH and is disposed in the channel hole H. That is, the tunnel insulating layer TI is formed on an inner surface of the channel hole H, and the channel layer CH is formed on an inner surface of the tunnel insulating layer TI. The tunnel insulating layer TI may be penetrated by the contact source layer CS as shown in FIG. 1B. The contact source layer CS may pass through the tunnel insulating layer TI and directly contact the channel layer CH. The contact source layer CS may include a silicon layer.

The data storage layer DS may include a region disposed inside the channel hole H and a region disposed outside the channel hole H. For example, the data storage layer DS encloses the outer surface of the tunnel insulating layer TI, and is disposed outside the channel hole H. For example, as will be described later herein, the tunnel insulating layer TI has depressions h1 to increase the volumes of respective recess areas RA. Therefore, the data storage layer DS enclosing the tunnel insulating layer TI may extend not only outward from the channel hole H, but also into the channel hole H.

As will be described later herein, the tunnel insulating layer TI is formed on the inner surface of the channel hole H through the channel hole H. The data storage layer DS is formed on the outer surface of the tunnel insulating layer TI through the slit SI. Consequently, while the tunnel insulating layer TI is continuously formed along the inner surface of the channel hole H, the data storage layer DS is intermittently formed along the outer surface of the tunnel insulating layer TI. In other words, while the tunnel insulating layer TI is continuously formed along the outer surface of the channel layer CH, the data storage layer DS is intermittently formed along the outer surface of the tunnel insulating layer TI. That is, the data storage layer DS is formed in each of spaces defined between the interlayer insulating layers ILD. One channel layer CH and one tunnel insulating layer TI enclosing the channel layer CH are present in each channel hole H. On the other hand, the data storage layer DS enclosing each tunnel insulating layer TI is provided in the form of a plurality of data storage patterns separated from each other by the interlayer insulating layers ILD.

The blocking insulating layer BI which is formed on the data storage layer DS is also disposed outside the channel hole H. That is, the blocking insulating layer BI encloses an outer surface of the data storage layer DS, and is disposed outside the channel hole H. As will be described later herein, the blocking insulating layer BI is formed on the outer surface of the data storage layer DS through the slit SI. The blocking insulating layer BI may be disposed between the interlayer insulating layers ILD, and be divided into a plurality of blocking insulating patterns by the interlayer insulating layers ILD.

The conductive patterns CP which is formed on the blocking insulating layer BI are disposed outside the channel hole H. The conductive patterns CP also enclose the outer surface of the blocking insulating layer BI, and are formed on the outer surface of the blocking insulating layer BI through the slit SI.

According to an embodiment of the present disclosure having the above-mentioned configuration or configurations, since only the tunnel insulating layer TI among the tunnel insulating layer TI, the data storage layer DS and the blocking insulating layer BI that constitute the multilayer layer ML is disposed in the channel hole H having a confined space, the tunnel insulating layer TI may be formed to have a relatively large thickness. In other words, in an embodiment of the present disclosure, even the space in the channel hole which has been used to form the data storage layer and the blocking insulating layer in the conventional art may be used to form the tunnel insulating layer. Thereby, the thickness of the tunnel insulating layer may be markedly increased. According to an embodiment of the present disclosure, the space in the channel hole H having a small critical dimension (CD) may be efficiently used. The critical dimension (CD) of the channel hole H may be defined as a width of the channel hole H. Furthermore, in an embodiment of the present disclosure, because the data storage layer DS is disposed outside the channel hole H, the data storage layer DS may have a relatively large thickness without being limited by the confined space of the channel hole. An increase in thickness of the tunnel insulating layer TI and the data storage layer DS may improve the charge retention characteristics, thus enhancing the operational reliability of the semiconductor device.

The data storage layer DS according to an embodiment of the present disclosure is disposed on only one side adjacent to the tunnel insulating layer TI in each of the spaces defined between the interlayer insulating layers ILD. Due to this, each of the conductive patterns CP disposed in the spaces defined between the interlayer insulating layers ILD may have a relatively large thickness. That is, in an embodiment of the present disclosure, the data storage layer DS is disposed outside the channel hole H and disposed on only one side close to the tunnel insulating layer TI in each of the spaces defined between the interlayer insulating layers ILD. This makes it possible to increase the thicknesses of the tunnel insulating layer TI and the data storage layer DS without reducing the thickness of the conductive pattern CP in each of the spaces defined between the interlayer insulating layers ILD. The blocking insulating layer BI which is disposed between the data storage layer DS and the conductive patterns CP extend not only into space between the interlayer insulating layers ILD and the conductive patterns CP but also into space between the conductive patterns CP and the data storage layer DS.

In an embodiment of the present disclosure, a select transistor is formed in a junction between a select line among the conductive patterns CP and each channel layer CH, and a memory cell is formed in a junction between a word line among the conductive patterns CP and each channel layer CH. The uppermost and lowermost conductive patterns among the conductive patterns CP may be respectively used as an upper select line and a lower select line. Conductive patterns disposed between the uppermost and lowermost conductive patterns among the conductive patterns CP may be used as word lines. In accordance with the foregoing configuration, each of the channel layers CH may couple in series an upper select transistor coupled to the upper select line, a lower select transistor coupled to the lower select line, and memory cells coupled to the word lines. As such, the straight memory string includes the upper select transistor, the memory cells, and the lower select transistor that are coupled in series to each other. However, the present disclosure is not limited to this, and the memory string may have a 'U' shape. The same description as that of the straight memory string may be applied to the U-shaped memory string, other than the facts that the channel layer is formed in a U shape, the channel layer includes a pipe channel layer which is embedded in a pipe gate and a source side channel layer and a drain side channel layer which extend from the pipe channel layer, and the source layer is coupled to an upper end of the source side channel layer. In the present disclosure, for the sake of explanation, the following description will be focused on the case of the straight memory string.

Figure 2A:
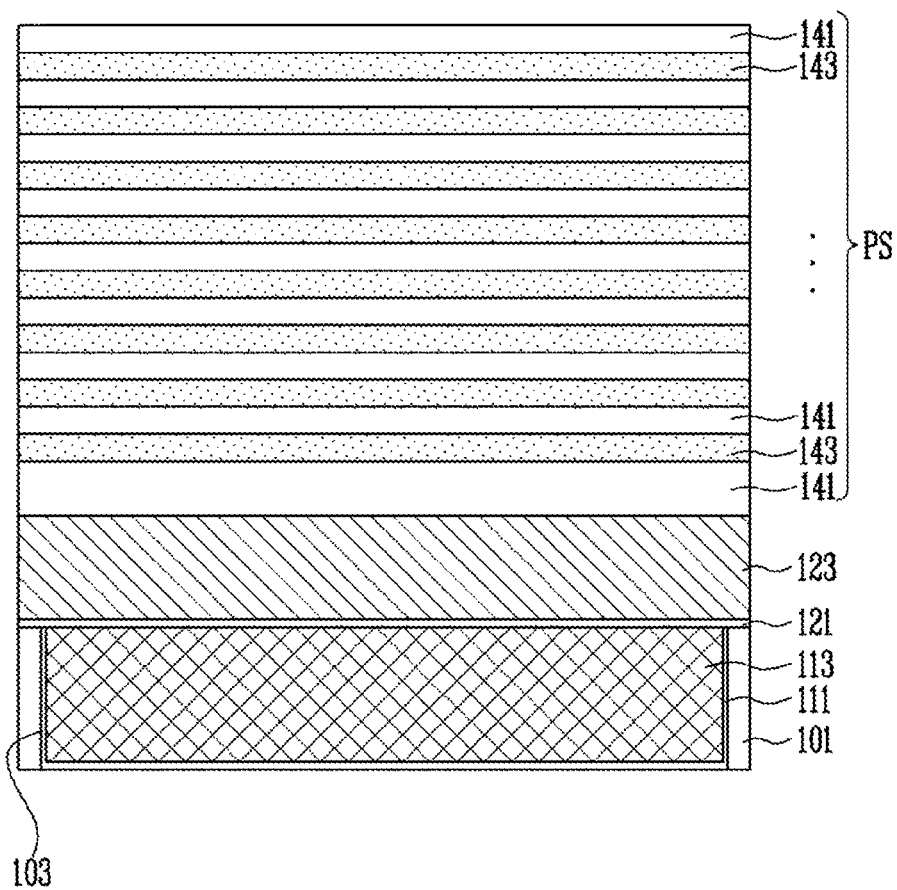
FIGS. 2A to 2P are sectional views illustrating a method of manufacturing a semiconductor device in accordance with an embodiment of the present disclosure.
Figure 2B:
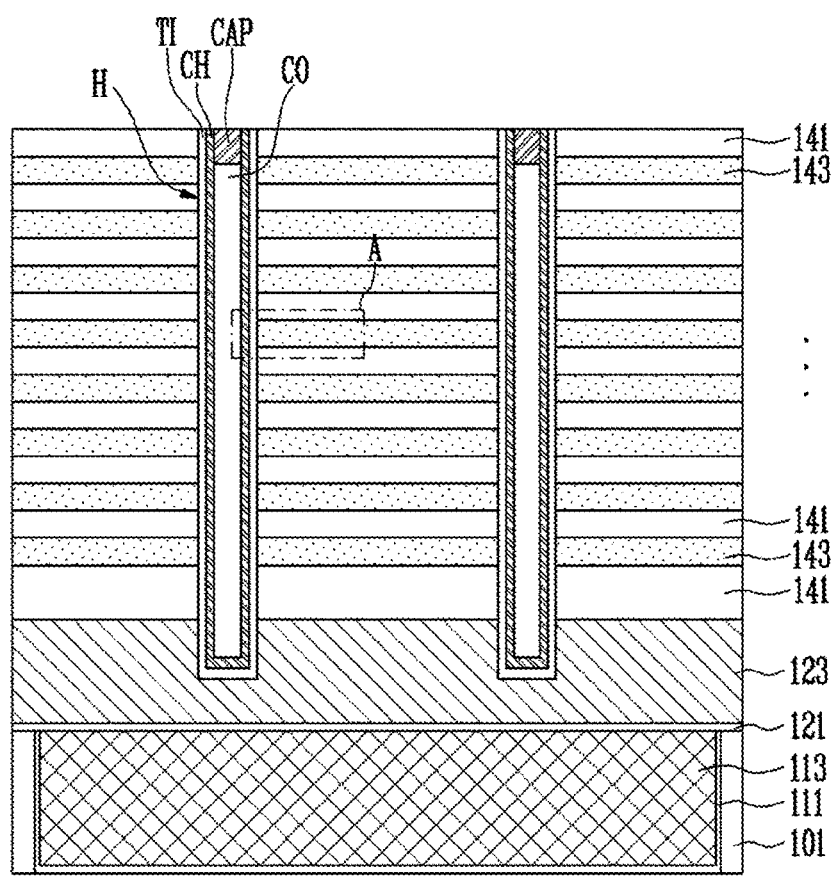
Figure 2C:
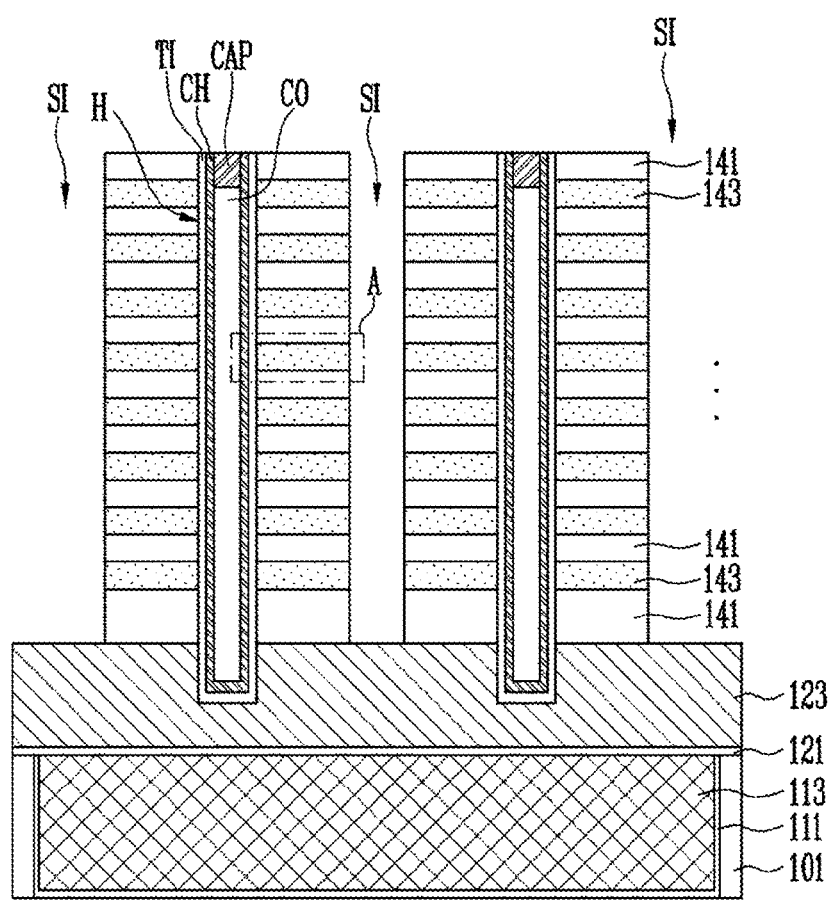
Figure 2E:
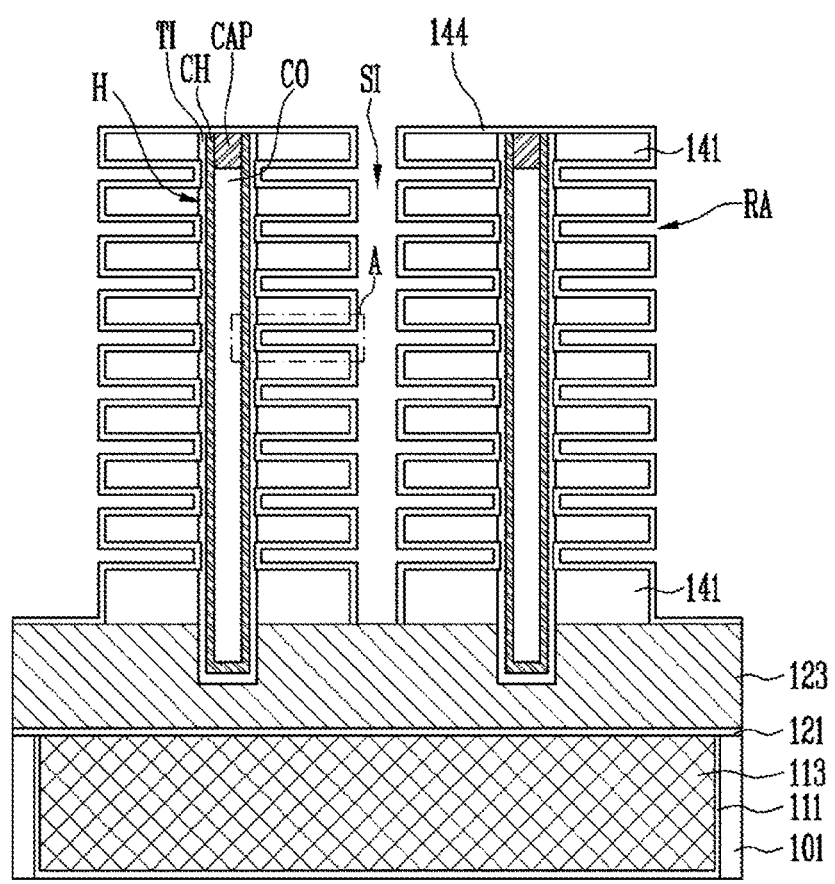
Figure 2G:
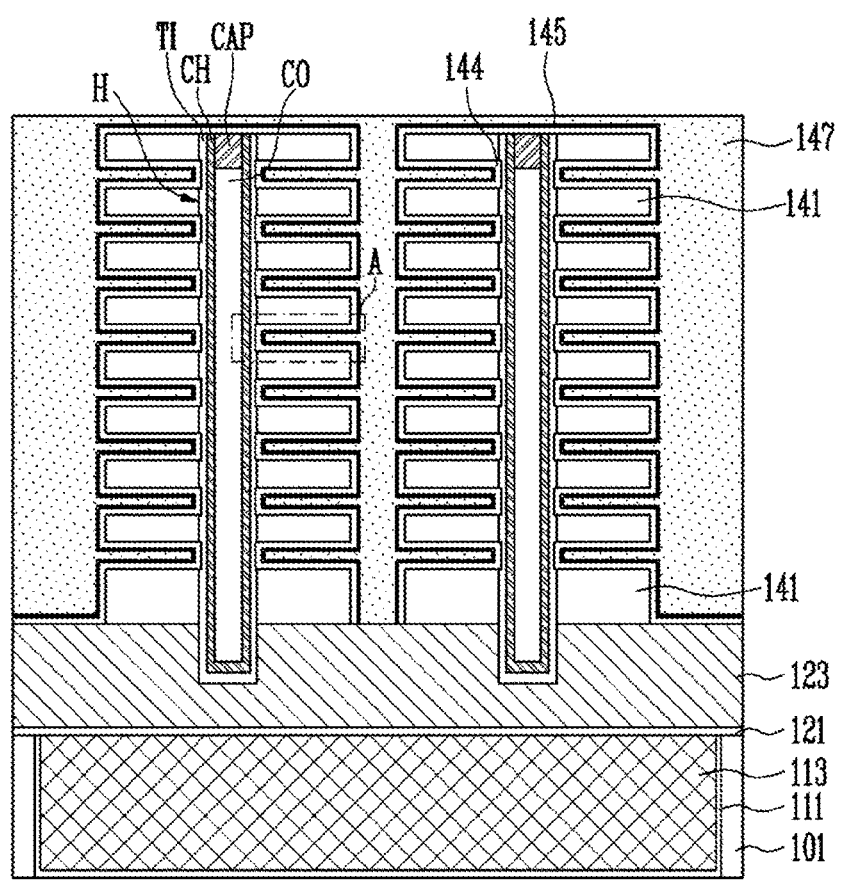
Figure 2H:
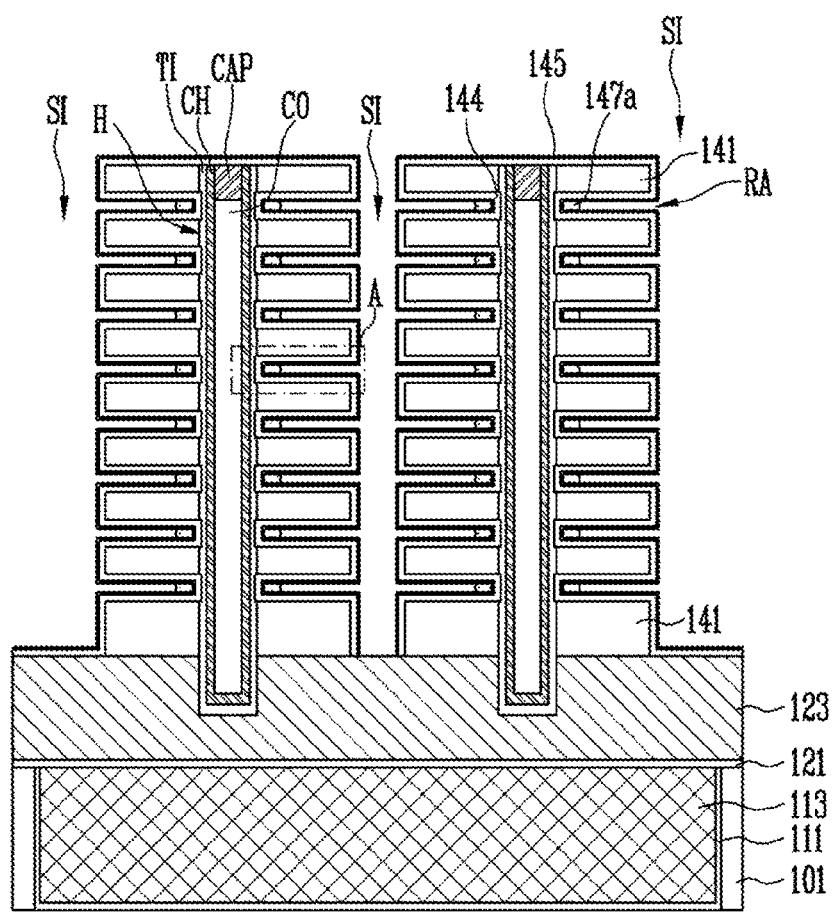
Figure 2I:
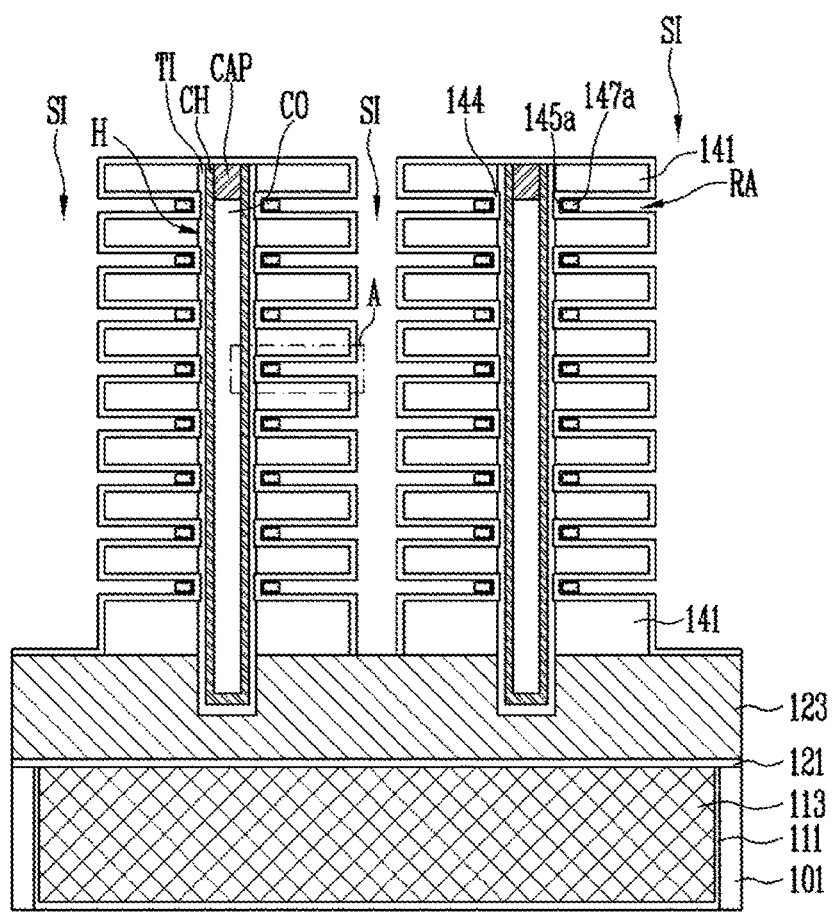
Figure 2J:
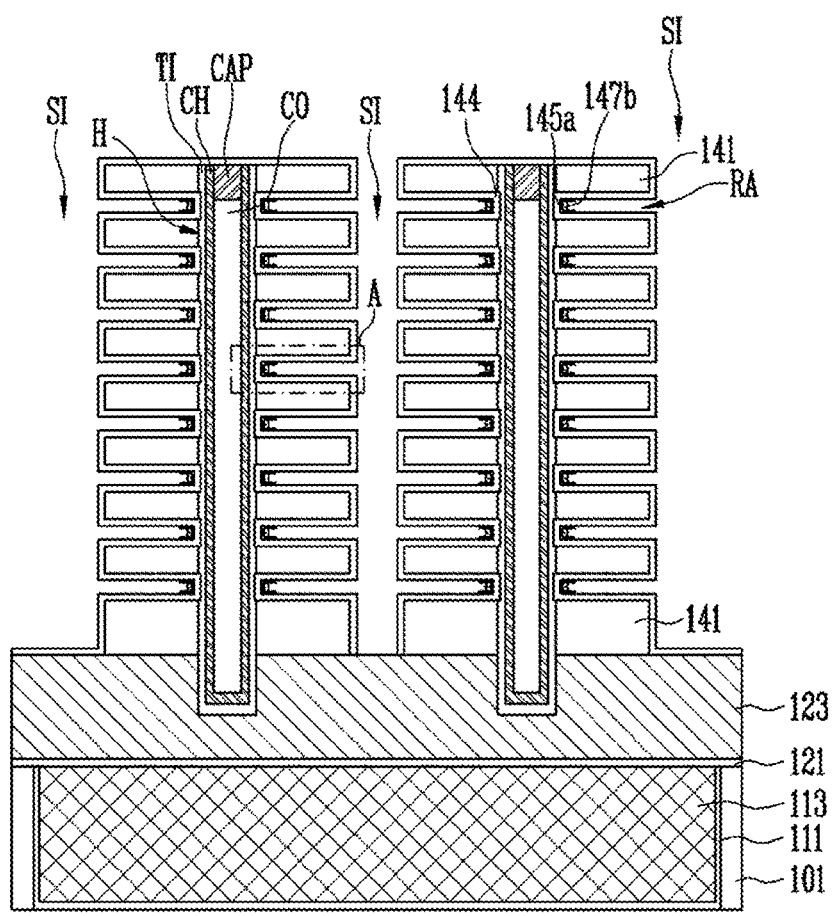
Figure 2K:
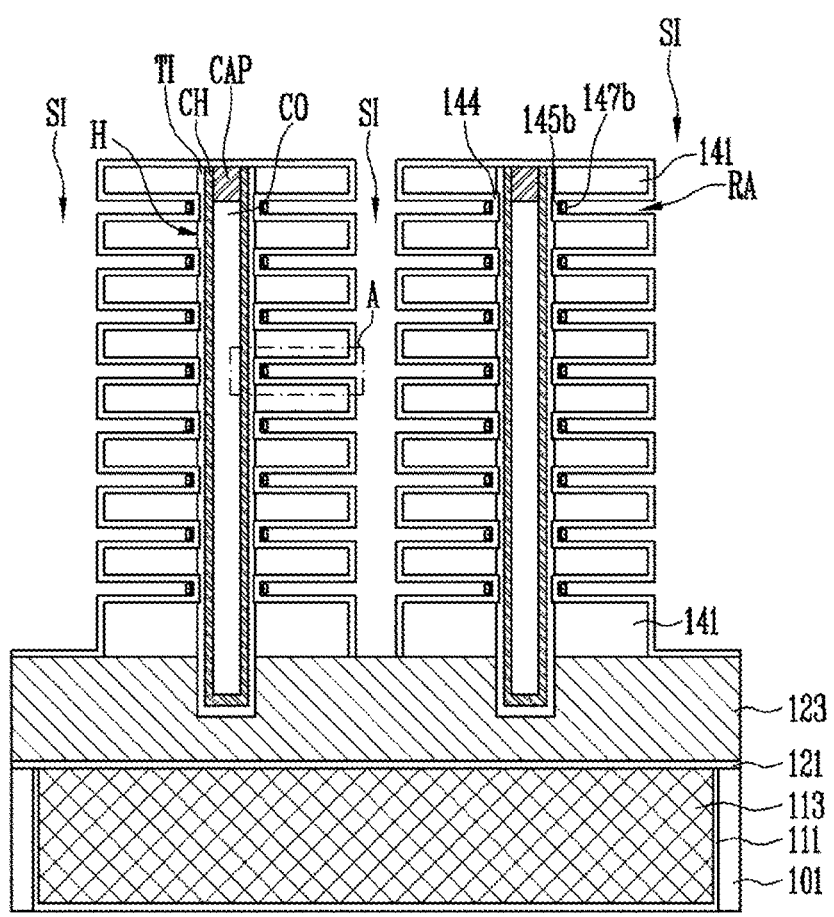
Figure 2L:
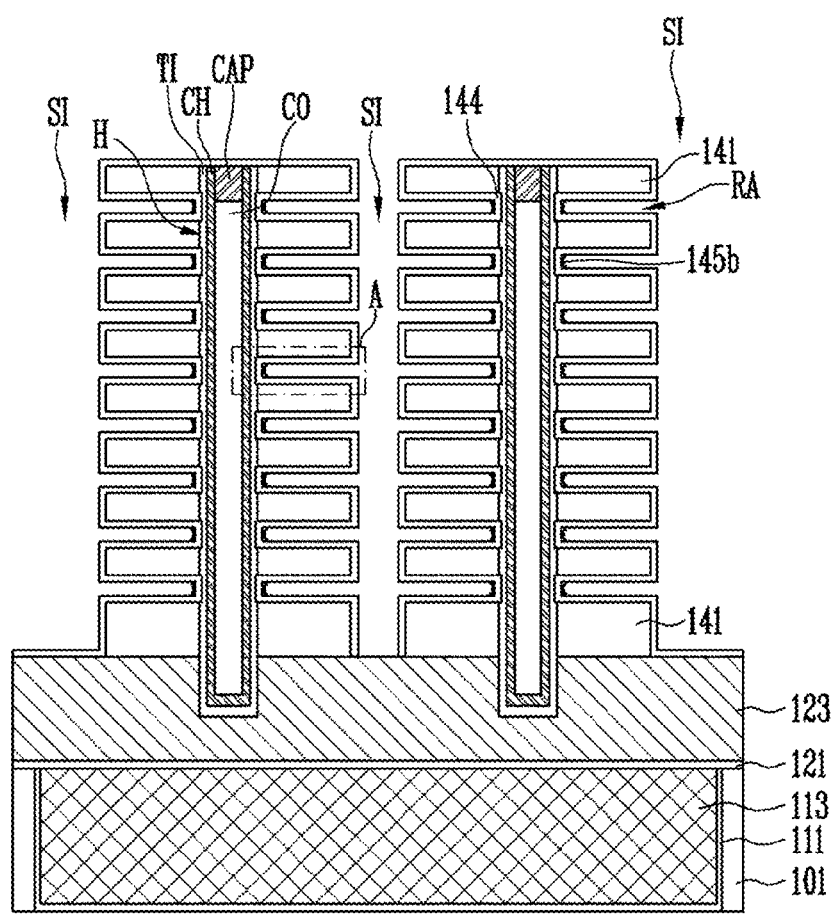
Figure 2M:
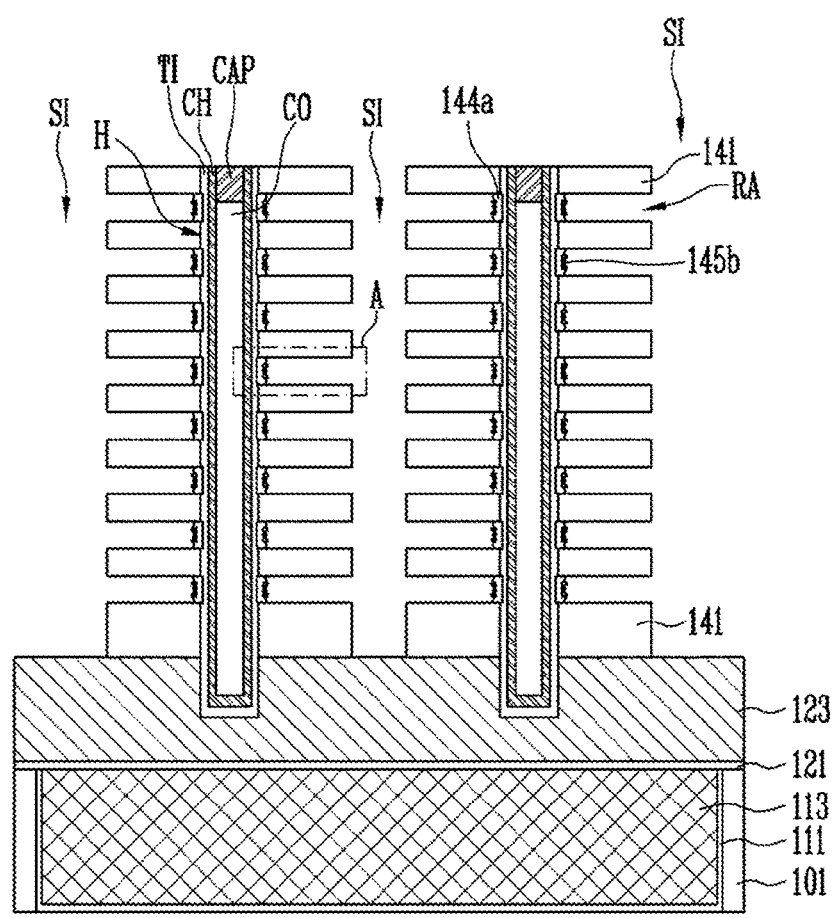
Figure 2N:
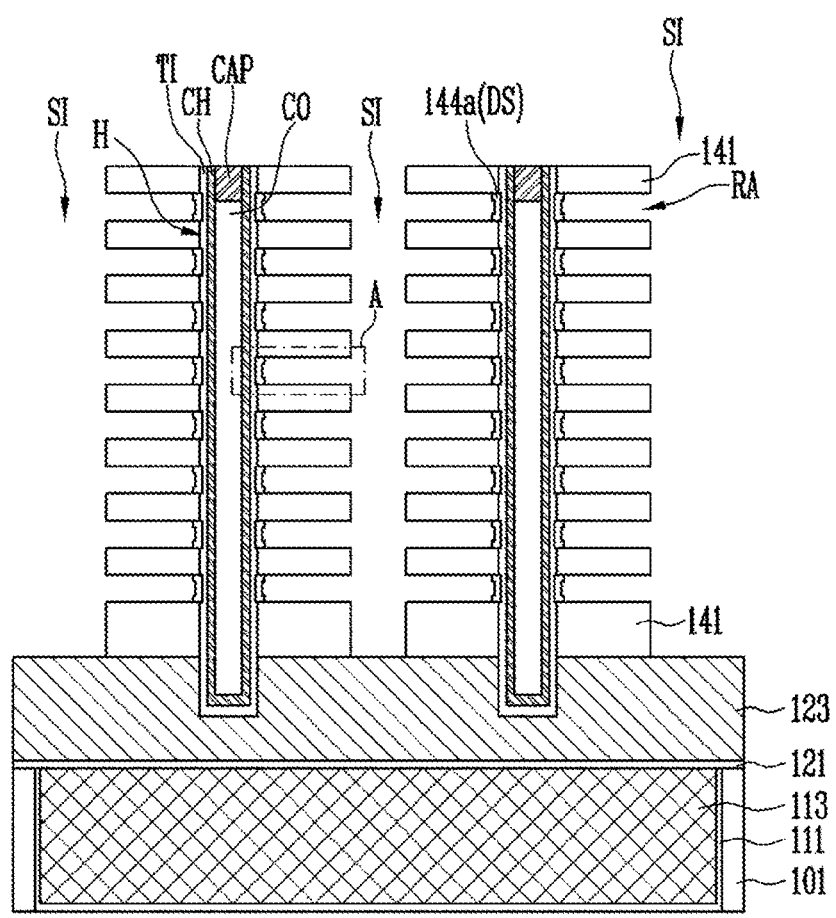
Figure 20:
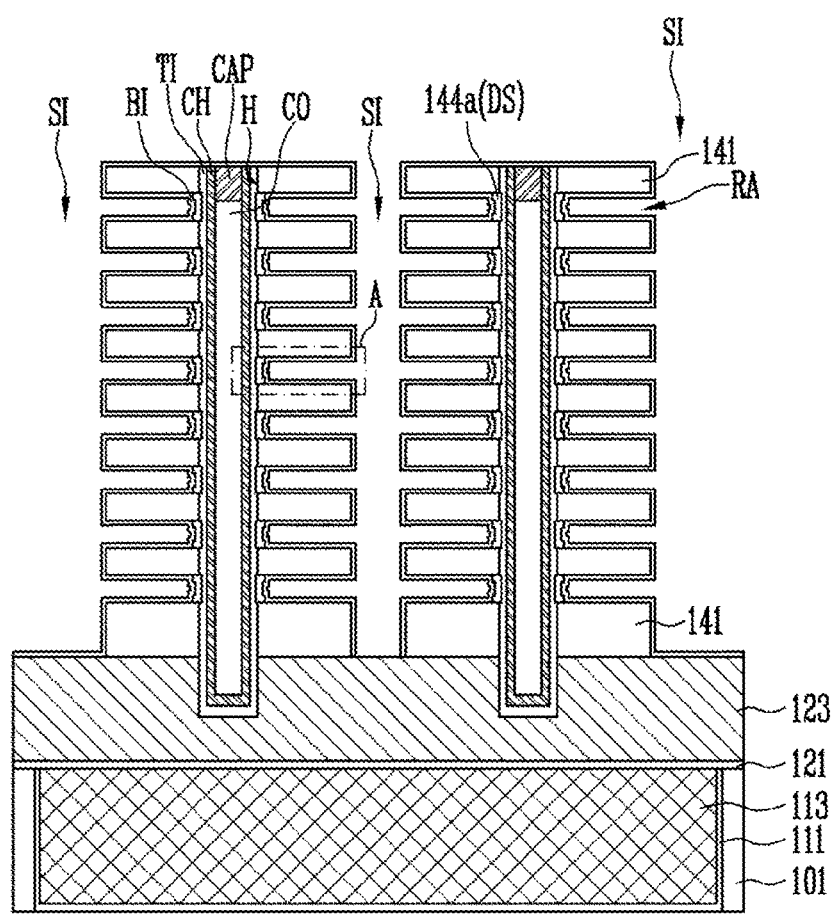
Figure 2P:
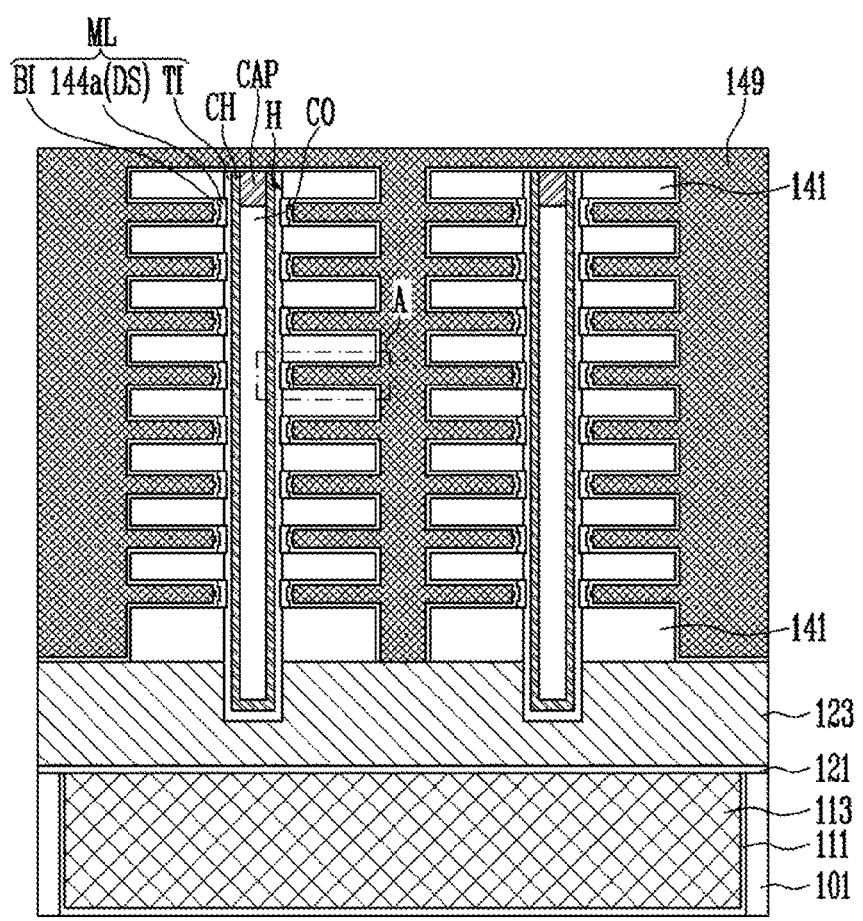
Figure 3A:
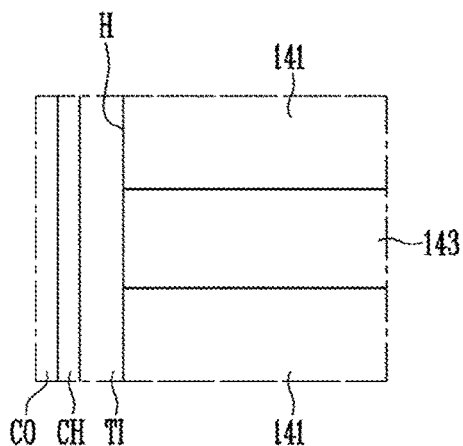
FIGS. 3A to 3O are enlarged views of region A of FIGS. 2B to 2P respectively.

FIGS. 2A to 2P are sectional views illustrating a method of manufacturing a semiconductor device in accordance with an embodiment of the present disclosure. For example, FIGS. 2A to 2P are sectional views illustrating a method of manufacturing the semiconductor device illustrated in FIG. 1A. FIGS. 3A to 3O are enlarged views of region A of FIGS. 2B to 2P, respectively.

Referring to FIG. 2A, a lower source layer 113 may be formed on a substrate (not illustrated) including a lower structure. Although not illustrated, the lower structure may include drive transistors which form a circuit for driving memory strings of the semiconductor device, and contact plugs and routing lines which are coupled to the drive transistors.

The lower source layer 113 may be formed of metal having a resistance lower than that of an upper source layer 123, which is to be formed during a following process. For example, the lower source layer 113 may include tungsten.

The lower source layer 113 may be formed through a damascene process. For instance, a source insulating layer 101 is formed on the substrate including the lower structure. Subsequently, a trench 103 is formed by etching the source insulating layer 101. Thereafter, the trench 103 is filled with the lower source layer 113. A first barrier metal layer 111 may be further formed before the lower source layer 113 is formed. The first barrier metal layer 111 may be formed on a surface of the trench 103. The lower source layer 113 is disposed on the first barrier metal layer 111, and the trench 103 is completely filled with the lower source layer 113. After the first barrier metal layer 111 and the lower source layer 113 are formed, the lower source layer 113 and the first barrier metal layer 111 may be planarized until the source insulating layer 101 is exposed.

Thereafter, the upper source layer 123 may be formed on the source insulating layer 101 including the lower source layer 113. Before the upper source layer 123 is formed, a second barrier metal layer 121 may be further formed on the source insulating layer 101 including the lower source layer 113 to prevent metal diffusion from the lower source layer 113.

The upper source layer 123 may be formed of a doped silicon layer. The doped silicon layer may include an n- or p-type impurity. The impurity may be added through an implant process after the upper source layer 123 is deposited.

Subsequently, a preliminary stack structure PS in which first material layers 141 and second material layers 143 are alternately stacked is formed on the upper source layer 123.

The first material layers 141 and the second material layers 143 are made of different materials. The first material layers 141 may be formed of insulating material for interlayer insulating layers, and the second material layers 143 may be used as sacrificial layers and be formed of sacrificial insulating material having an etching selectivity different from that of the first material layers 141. In this case, the first material layers 141 may be formed of a silicon oxide layer, and the second material layers 143 may be formed of a silicon nitride layer.

Hereinafter, description will be made also with reference to FIGS. 3A to 3O.

Referring to FIGS. 2B and 3A, channel holes H are formed passing through the first and second material layers 141 and 143 and the upper source layer 123. The channel holes H may extend to pass through a portion of the upper source layer 123.

Subsequently, a channel layer CH which is enclosed by a tunnel insulating layer TI is formed in each of the channel holes H. The tunnel insulating layer TI may be formed on a surface of each of the channel holes H. The channel layer CH may be formed on the tunnel insulating layer TI. The channel layer CH may be formed such that each of the channel holes H is completely filled therewith, or a central region of each channel hole H is open. In the case where the channel layer CH is formed such that the central region of each channel hole H is open, the central region of each channel hole H may be filled with a core insulating layer CO. The core insulating layer CO may be formed to have a height less than a depth of each channel hole H. In this case, a capping layer CAP may be formed on the core insulating layer CO so that an upper end of each channel hole H is closed.

As illustrated in FIG. 3A, the tunnel insulating layer TI is formed to have a relatively large thickness on a surface of the channel hole H. Since only the tunnel insulating layer TI of the multilayer layer ML is formed in the channel hole H, there may be provided a space allowing the tunnel insulating layer TI to have an increased thickness, compared to a conventional method in which all of the tunnel insulating layer, the data storage layer and the blocking insulating layer are formed in the channel hole. For instance, the tunnel insulating layer TI may be thicker than the channel layer CH. As will be described later herein, a data storage layer and a blocking insulating layer may be formed outside the channel hole.

Figure 3B:
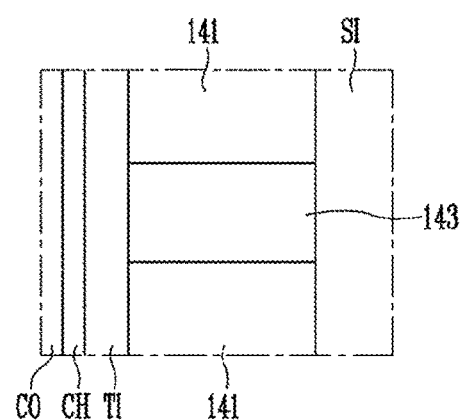

Referring to FIGS. 2C and 3B, a slit SI is formed to pass through the first and second material layers 141 and 143 by etching portions of the first and second material layers 121 and 123.

In the case where the first material layers 141 are formed of insulating material for interlayer insulating layers and the second material layers 123 are formed of insulating material for sacrificial layers, the slit SI may be formed by using a difference in etching selectivity between the upper source layer 123 formed of conductive material such as doped silicon, and the first and second material layers 141 and 143 formed of insulating material. For example, during a process of etching the first and second material layers 141 and 123 formed of insulating material, the upper source layer 123 formed of conductive material may be used as an etch stop layer. Consequently, the slit SI may be formed to have a constant depth.

Figure 3C:
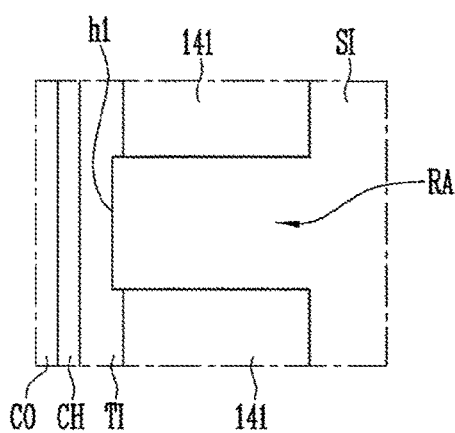

Referring to FIGS. 2D and 3C, the second material layers 143 are selectively removed through the slit SI to form recess areas RA. In this regard, the channel layers CH are supported by the upper source layer 123, so that the entire structure thereof may be stably maintained.

As illustrated in FIG. 3C, when the recess areas RA are formed, a portion of each of the first material layers 141 exposed through an open area from which the second material layers have been removed may be removed. Furthermore, portions of a sidewall of the tunnel insulting layer exposed through the open area from which the second material layers have been removed may be removed. As the portions of the sidewall of the tunnel insulating layer are removed, the tunnel insulating layer TI may include depressions h1 which are concave toward the channel layer CH.

When the second material layers 143 are removed, the portion of each first material layer and the portions of the sidewall of the tunnel insulating layer are removed together, thus making it possible to widen the recess areas RA. As described above, the first material layers 141 formed of the insulating material for the interlayer insulating layers may be formed of silicon oxide layers, and the tunnel insulating layer TI may be formed of a silicon oxide layer capable of tunneling. Therefore, the portions of the first material layers 141 and the sidewall of the tunnel insulating layer may be removed by the same etching material. Consequently, it becomes easy to form the recess areas each having a relatively wide area.

Each wide recess area RA provides space in which a data storage layer to be formed therein may have a relatively large thickness. In addition, the wide recess area RA provides space in which a third material layer 149 for conductive patterns CP which will be described later herein may have a relatively large thickness.

Figure 3D:
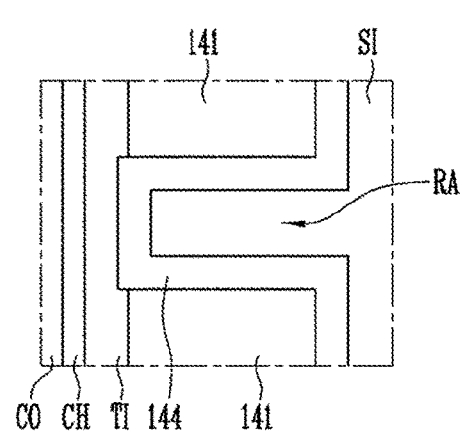

Referring to FIGS. 2E and 3D, a data storage layer 144 is formed in the recess areas RA through the slit SI. The data storage layer 144 which is formed through the slit SI may cover inner surfaces of the recess areas RA. The data storage layer 144 may be formed by an atomic layer deposition method.

As illustrated in FIG. 3D, the data storage layer 144 formed in the recess areas RA has a relatively large thickness. For example, the data storage layer 144 may be thicker than the channel layer CH. Since the data storage layer 144 is formed outside the channel hole H, the data storage layer may have a large thickness regardless of the size of the channel hole having a limited critical dimension.

Each recess area RA may have a relatively large space including not only an area from which the corresponding second material layer 143 has been removed, but also an area from which the portions of the associated first material layers 141 have been removed and an area from which a corresponding portion of the sidewall of the tunnel insulating layer TI has been removed. Therefore, the data storage layer 144 that is formed to cover the inner surfaces of the recess areas RA may protrude further toward the channel layer CH than the first material layers 141.

Figure 3E:
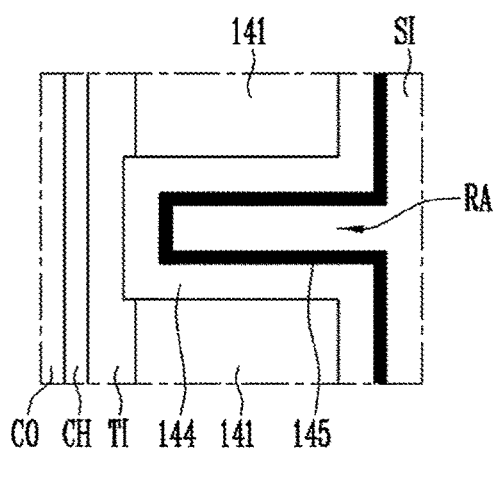

Referring to FIGS. 2F and 3E, an inner sacrificial layer 145 is formed on the data storage layer 144. The inner sacrificial layer 145 may be formed by an atomic layer deposition method.

The inner sacrificial layer 145 may be formed of material which may be selectively removed during a following process. For example, the inner sacrificial layer 145 may be formed of material having an etching selectivity different from that of the data storage layer 144. For example, the inner sacrificial layer 145 may be formed of a metal layer. The metal layer may be a titanium nitride TiN.

Figure 3F:
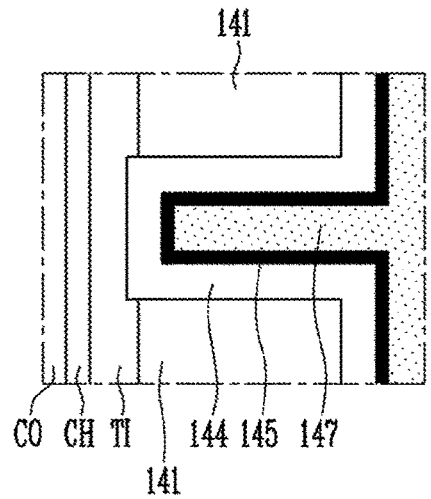

Referring to FIGS. 2G and 3F, an outer sacrificial layer 147 with which the remaining spaces of the recess areas RA are filled is formed on the inner sacrificial layer 145. The outer sacrificial layer 147 may be formed by an atomic layer deposition method.

The outer sacrificial layer 147 may be formed of material which may be selectively removed during a following process. For example, the outer sacrificial layer 147 may be formed of material having an etching selectivity different from those of the data storage layer 144 and the inner sacrificial layer 145. For example, the outer sacrificial layer 147 may be formed of an oxide layer.

The inner sacrificial layer 145 disposed between the data storage layer 144 and the outer sacrificial layer 147 may prevent deterioration in charge retention characteristics of the data storage layer 144 which may be caused when the data storage layer 144 made of a nitride comes into direct contact with the outer sacrificial layer 147 made of an oxide.

Subsequently, as will be described later herein, the inner sacrificial layer 145 and the outer sacrificial layer 147 are removed. Hereinafter, this process will be described below.

Figure 3G:
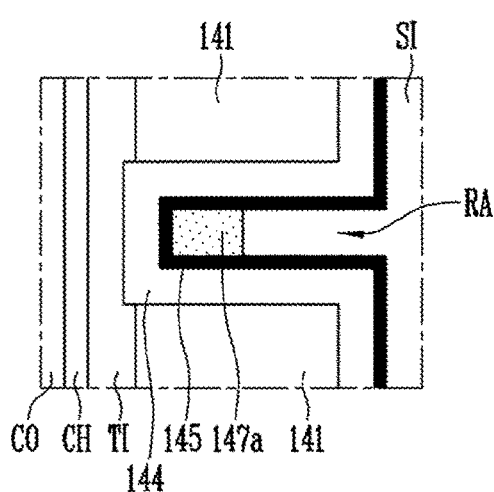

Referring to FIGS. 2H and 3G, the outer sacrificial layer 147 is partially removed such that the outer sacrificial layer 147 may remain between the first material layers 141, that is, in the recess areas RA. Here, the slit SI that has been closed by the outer sacrificial layer 147 may open. Furthermore, portion of each of the recess areas RA that have been closed by the outer sacrificial layer 147 may open.

A cleaning process using a cleaning solution may be used to partially remove the outer sacrificial layer 147. The cleaning solution capable of selectively removing only the outer sacrificial layer 147 is used so that the inner sacrificial layer 145 is not removed. The cleaning process for selectively removing the outer sacrificial layer 147 is controlled such that a first outer sacrificial pattern 147a remains in one side of each recess area RA adjacent to the tunnel insulating layer TI.

Figure 3H:
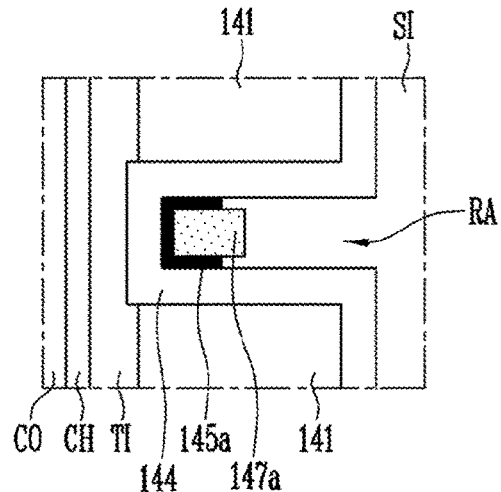

Referring to FIGS. 2I and 3H, the inner sacrificial layer 145 is partially removed such that the inner sacrificial layer 145 may remain between the first material layers 141, that is, in each recess area RA. Here, the inner sacrificial layer 145 is completely removed from the slit SI, whereby the slit SI opens.

A cleaning process using a cleaning solution may be used to partially remove the inner sacrificial layer 145. For instance, a wet cleaning process may be used. The wet cleaning process may be controlled such that first inner sacrificial patterns 145a remain between the first material layers 141. The cleaning solution which can selectively remove only the inner sacrificial layer 145 may be used such that the first outer sacrificial patterns 147a and the data storage layer 144 are not removed. The first outer sacrificial patterns 147a may function to protect the first inner sacrificial patterns 145a during the wet cleaning process of removing the inner sacrificial layer 145.

Figure 3I:
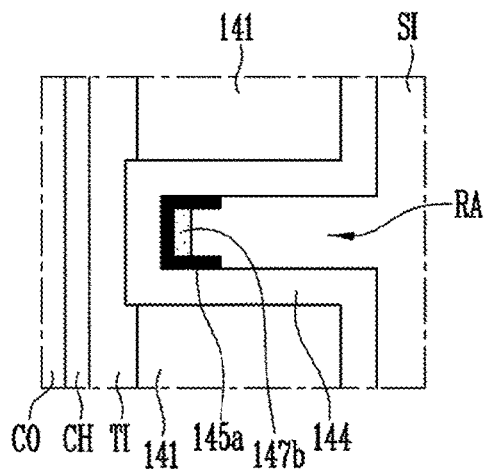

Subsequently, referring to FIGS. 2J and 3I, each of the first outer sacrificial patterns 147a is partially removed such that a second outer sacrificial pattern 147b remains in one side of each recess area RA adjacent to the tunnel insulating layer TI. Here, the space in each recess area RA may further expand.

A process of removing a portion of each of the first outer sacrificial patterns 147a may include the cleaning process using the cleaning solution for partially removing the outer sacrificial layer. The cleaning process may be controlled such that, in the recess areas RA formed between the first material layers 141, the second outer sacrificial patterns 147b remain on the respective sidewalls of the recess areas RA adjacent to the tunnel insulating layer TI. A clean solution for removing only the outer sacrificial layer may be used such that the first inner sacrificial patterns 145a and the data storage layer 144 are not removed. The first inner sacrificial patterns 145a may function to protect the second outer sacrificial patterns 147b during the cleaning process of removing the first outer sacrificial patterns 147a.

Figure 3J:
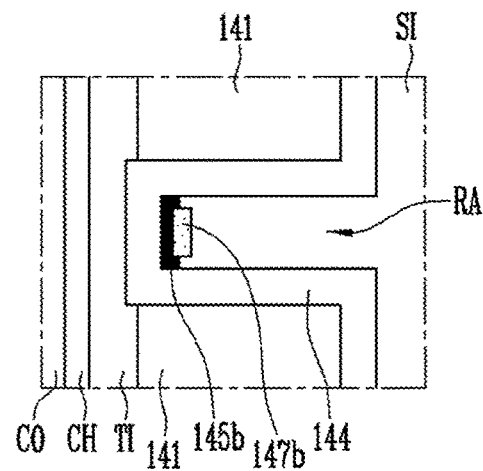

Referring to FIGS. 2K and 3J, in each of the recess areas RA formed between the first material layers 141, the first inner sacrificial pattern 145a is partially removed such that a second inner sacrificial pattern 145b remain on the sidewall of the recess area RA adjacent to the tunnel insulating layer TI. Here, the space in the recess area RA may further expand.

A cleaning process using a cleaning solution may be used to remove a portion of each of the first inner sacrificial patterns 145a. The cleaning process may be controlled such that, in the recess areas RA formed between the first material layers 141, the second inner sacrificial patterns 145b remain on the sidewalls of the recess areas RA adjacent to the tunnel insulating layer TI without being removed through the cleaning process. A clean solution for removing only the inner sacrificial layer may be used such that the second outer sacrificial patterns 147b and the data storage layer 144 are not removed. The second outer sacrificial patterns 147b may function to protect the second inner sacrificial patterns 145b during the cleaning process of removing the first inner sacrificial patterns 145a.

As such, the process of removing the outer sacrificial layer 147 and the process of removing the inner sacrificial layer 145 are alternately repeatedly performed such that open space of each recess area RA expands and the inner and outer sacrificial layers 145 and 147 remain as the second inner sacrificial pattern 145b and the second outer sacrificial pattern 147b in one side of each recess area RA adjacent to the tunnel insulating layer TI. Here, the removed portions of the inner and outer sacrificial layers 145 and 147 may be horizontal components of the inner and outer sacrificial layers 145 and 147.

Figure 3K:
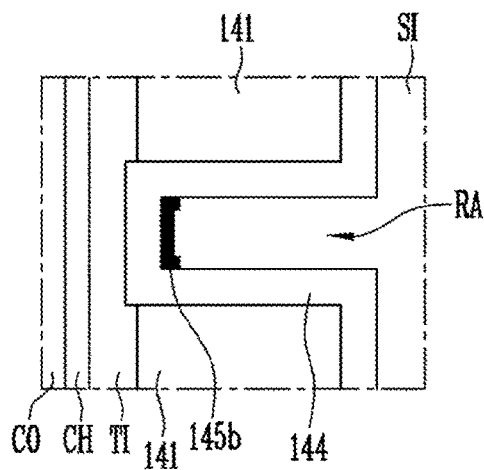

Thereafter, as illustrated in FIGS. 2L and 3K, the second outer sacrificial patterns 147b are completely removed. That is, vertical components of the outer sacrificial layer disposed on the sidewall of the tunnel insulating layer TI is removed. Consequently, the open space of the recess area RA further expands.

An etching process may be used to remove the second outer sacrificial patterns 147b. In this case, there may be used a difference in etching selectivity between the inner sacrificial layer formed of conductive material such as a titanium nitride, and the outer sacrificial layer formed of insulating material. For example, during a process of etching the second outer sacrificial patterns 147b formed of insulating material, the second inner sacrificial patterns 145b formed of conductive material may be used as an etch stop layer. Thereby, the outer sacrificial layer may be completely removed.

Consequently, only the second inner sacrificial patterns 145b remain in the recess areas RA formed between the first material layers 141. The second inner sacrificial patterns 145b remain on the sidewalls of the recess areas RA adjacent to the tunnel insulating layer TI.

Figure 3L:
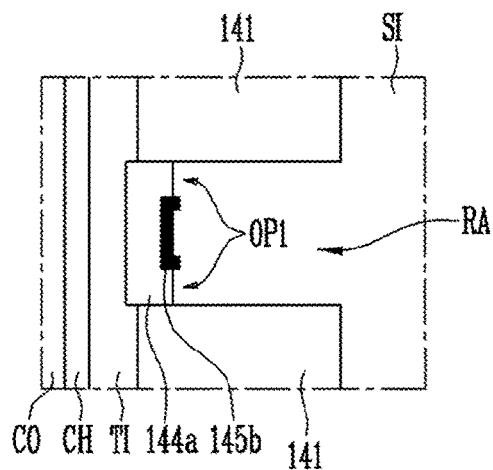

Referring to FIGS. 2M and 3L, the data storage layer 144 is partially removed. The data storage layer 144 is partially removed and remains as data storage patterns 144a on the respective sidewalls of the recess areas RA adjacent to the tunnel insulating layer TI. The data storage patterns 144a may be vertical components of the data storage layer 144. That is, the partially-removed portions of the data storage layer 144 may be horizontal components of the data storage layer 144.

An etching process may be used to partially remove the data storage layer 144. For example, an isotropic etching method may be used during the process of etching the data storage layer 144. For instance, a wet etching process may be used. That is, the data storage layer may be etched during the wet etching process such that vertical components of the data storage layer only remain in the recess areas.

When the data storage layer 144 is etched, the second inner sacrificial patterns 145b remain on the respective sidewalls of the recess areas adjacent to the tunnel insulating layer TI. Therefore, the data storage layer 144 may remain as the data storage patterns 144a each having a predetermined thickness. That is, the portions of the data storage layer 144 that are disposed between the second inner sacrificial patterns 145b and the tunnel insulating layer TI remain during the etching process rather than being etched, and thus form the respective data storage patterns 144a.

The process of etching the data storage layer 144 is performed until an upper surface or a lower surface of the second inner sacrificial pattern 145b is exposed by removing the data storage layer. For this reason, an etching rate of the etching process may be adjusted. Only the vertical components of the data storage layer may remain in the recess areas through the above-mentioned process.

During the process of partially etching the data storage layer 144, the data storage layer 144 is completely removed from the slit SI, whereby the slit SI completely opens. Furthermore, the open space of each recess area RA expands. Therefore, the recess area RA may include a first opening OP1 formed by partially etching the data storage layer 144. The first opening OP1 may provide sufficient space to form conductive patterns which will be described later herein.

Figure 3M:
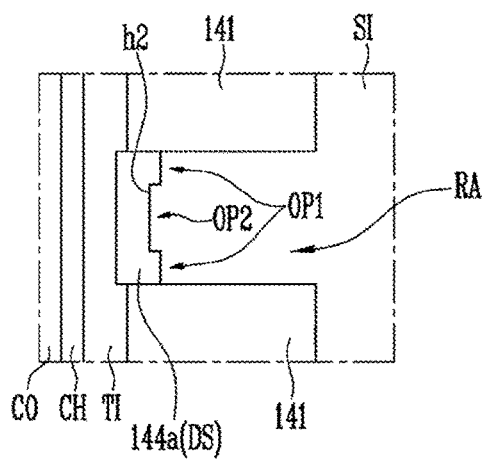

Thereafter, as illustrated in FIGS. 2N and 3M, the second inner sacrificial patterns 145b are removed. That is, the vertical components of the inner sacrificial layer are completely removed. Consequently, the open space of each recess area RA further expands. Therefore, each recess area RA may include a second opening OP2 formed when the second inner sacrificial patterns 145b are removed.

An etching process may be used to remove the second inner sacrificial patterns 145b. Here, each of the data storage patterns 144a that remain on the sidewalls of the recess areas RA adjacent to the tunnel insulating layer TI may be used as an etch stop layer. The inner sacrificial layer 145 may be formed of material having an etching selectivity different from that of the data storage layer 144. Consequently, the inner sacrificial layer may be completely removed with the data storage layer as the etch stop layer. In addition, the inner sacrificial layer 145 may have an etching selectivity different from that of the first material layers 141.

Through the above-described processes, the data storage layer 144 remains as the data storage patterns 144a on the sidewalls of the recess areas RA adjacent to the tunnel insulating layer TI, and each recess area RA may have a relatively large space between the first material layers 141. Since the second inner sacrificial patterns 145b are used as etching masks when the data storage patterns 144a are formed, a central portion of each of the data storage patterns 144a may have a depression H2 which is concave toward the channel layer CH. The shape of the depression h2 may correspond to that of the second opening OP2.

Figure 3N:
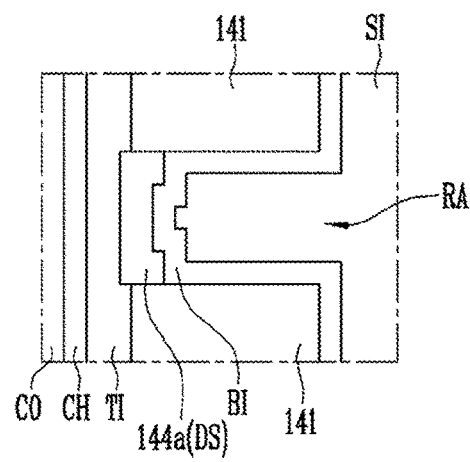
Figure 3O:
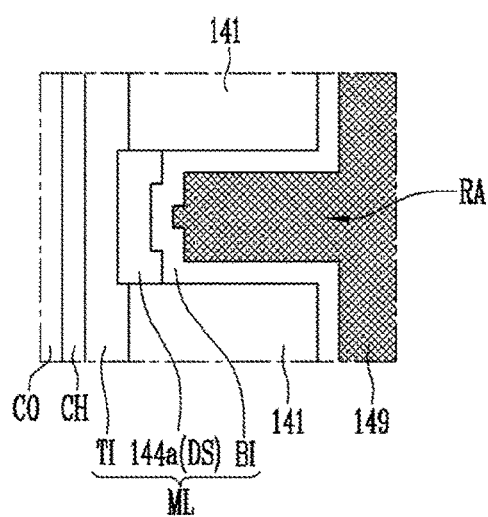

As illustrated in FIGS. 2O and 3N, a blocking insulating layer BI is formed through the slit SI. That is, the blocking insulating layer BI is formed on the data storage patterns 144a through the slit SI. The blocking insulating layer BI is formed on the data storage patterns 144a over the first openings OP1 and the second openings OP2 which are included in the recess areas RA.

Consequently, the semiconductor device according to an embodiment of the present disclosure may include, as a multilayer layer ML for performing the function of a memory cell, the tunnel insulating layer TI formed on the channel layer CH, the data storage layer DS formed on the tunnel insulating layer TI, and the blocking insulating layer BI formed on the data storage layer DS.

Referring to FIGS. 2P and 3O, the recess areas RA may be filled with a third material layer 149 through the slit SI. That is, the third material layer 149 with which the remaining spaces of the recess areas RA are filled may be formed on the blocking insulating layer BI. The third material layer 149 may be made of conductive material.

The portion of the blocking insulating layer and the portion of the third material layer 149 that are formed outside the recess area RA, in other words, in the slit SI, may be removed. As a result, as illustrated in FIG. 1A, conductive patterns CP are formed in the recess areas RA. The conductive patterns CP may include tungsten and the like. In accordance with the method of manufacturing the semiconductor device according to an embodiment of the present disclosure, the semiconductor device may be designed such that space in the channel hole H having a limited critical dimension is efficiently used and each of the tunnel insulating layer TI and the data storage layer DS has a relatively large thickness without requiring a reduction in thickness of the conductive patterns CP.

Figure 4A:
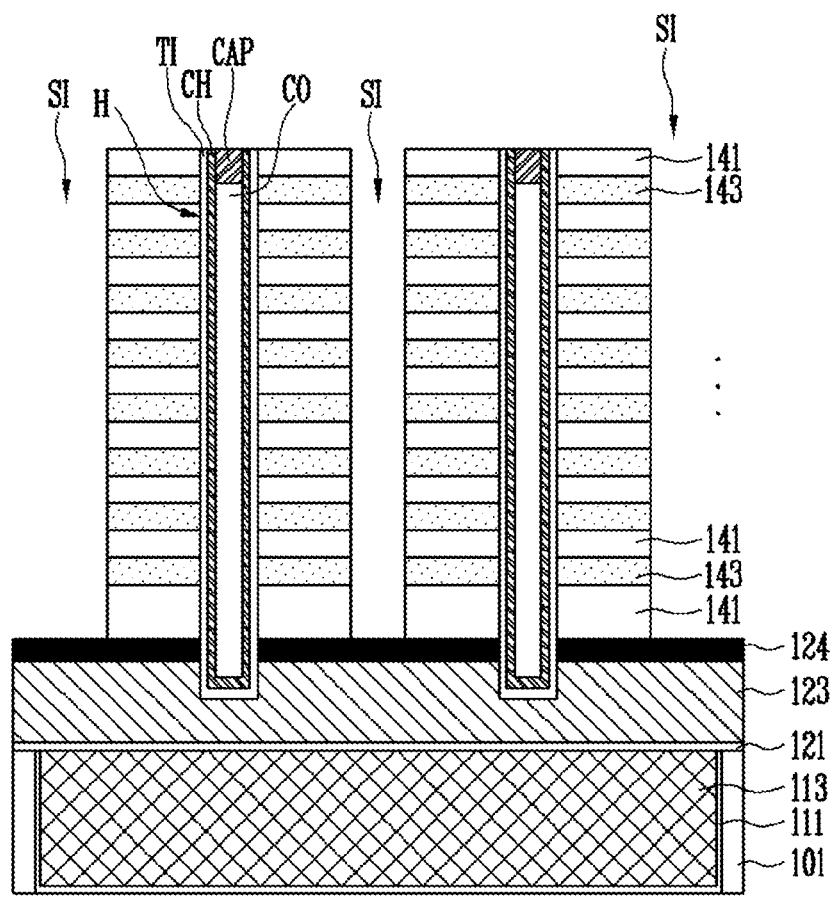
Figure 4B:
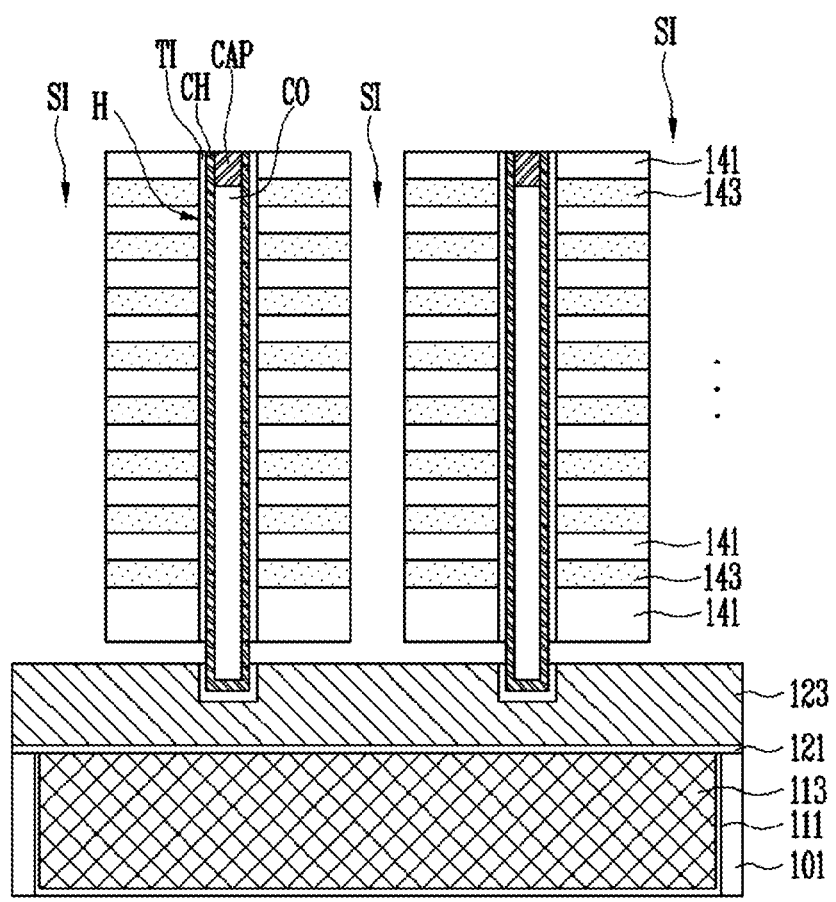

FIGS. 4A to 4C are sectional views illustrating a method of manufacturing a semiconductor device in accordance with an embodiment of the present disclosure. For example, FIGS. 4A to 4C are sectional views illustrating a method of manufacturing the semiconductor device illustrated in FIG. 1B.

Referring to FIG. 4A, the source insulating layer 101, the first barrier metal layer 111, the lower source layer 113, the second barrier metal layer 121, and the upper source layer 123 may be formed in the same manner as described above with reference to FIG. 2A. Subsequently, a sacrificial source layer 124 may be further formed over the upper source layer 123. The sacrificial source layer 124 may include an undoped polysilicon layer.

Subsequently, the first material layers 141 and the second material layers 143 which are the same as those described above with reference to FIG. 2A may be alternately stacked over the sacrificial source layer 124.

Subsequently, as described above with reference to FIGS. 2B and 3A, the channel holes H may be formed through the first and second material layers 141 and 143. The channel holes H may completely pass through the sacrificial source layer 124 and partially pass through the upper source layer 123.

Subsequently, as described above with reference to FIGS. 2B and 3A, the tunnel insulating layer TI, the channel layer CH, the core insulating layer CO, and the capping layer CAP may be formed in each of the channel holes H.

Subsequently, the first and second material layers 141 and 143 may be etched to form the slit ST passing therethrough. The sacrificial source layer 124 may be exposed by the slit SI.

Referring to FIG. 4B, the sacrificial source layer 124 may be removed through the slit SI. Subsequently, the tunnel insulting layer TI may be partially removed to expose a sidewall of the channel layer CH.

Referring to FIG. 4C, the contact source layer CS may be formed such that the contact source layer CS may directly contact the sidewall of the channel layer CH and the upper source layer 123. The contact source layer CS may be a silicon layer grown from the sidewall of the channel layer CH and the upper source layer 123. The contact source layer CS may be a silicon layer formed by a deposition method.

The subsequent processes may be performed in the same manner as described above with FIGS. 2D to 2P and 3C to 3O.

Figure 5:
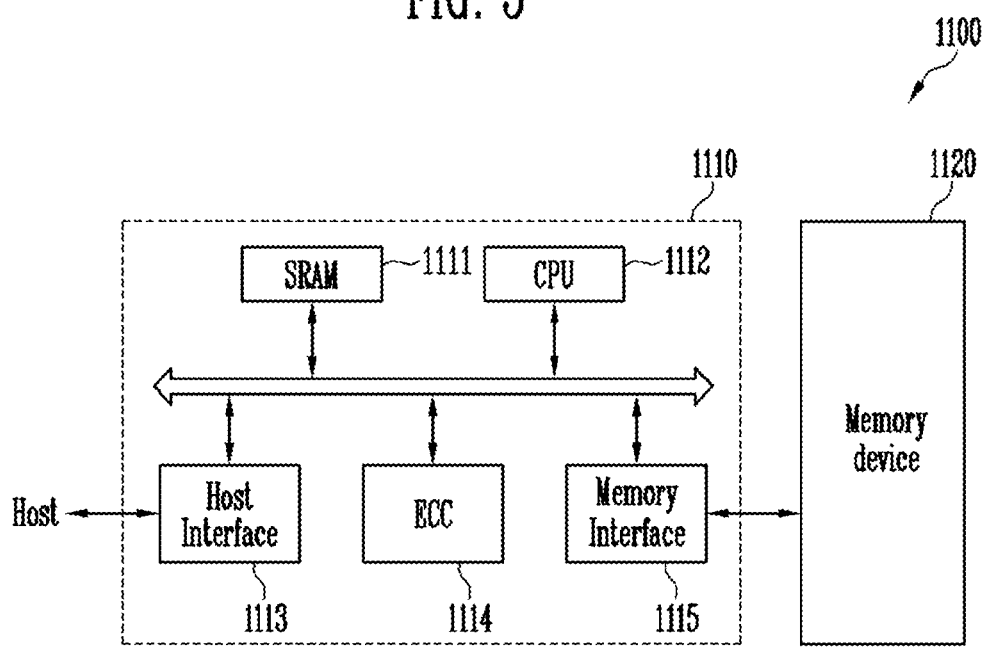
FIG. 5 is a block diagram illustrating the configuration of a memory system in accordance with an embodiment of the present disclosure.

FIG. 5 is a block diagram illustrating the configuration of a memory system according to an embodiment of the present disclosure.

Referring to FIG. 5, a memory system 1100 according to an embodiment of the present disclosure includes a memory device 1120 and a memory controller 1110.

The memory device 1120 may include the structures described with reference to FIG. 1A or 1B. For example, the memory device 1120 may include a data storage layer which encloses a tunnel insulating layer between interlayer insulating layers and is disposed on a side adjacent to the tunnel insulating layer. The memory device 1120 may be a multi-chip package including a plurality of flash memory chips.

The memory controller 1110 may control the memory device 1120, and include a static random access memory (SRAM) 1111, a CPU 1112, a host interface 1113, an error correction code (ECC) 1114, and a memory interface 1115. The SRAM 1111 is used as an operation memory of the CPU 1112. The CPU 1112 may perform general control operations for data exchange of the memory controller 1110. The host interface 1113 is provided with a data interchange protocol of a host coupled with the memory system 1100. Furthermore, the ECC 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or an SSD (Solid State Disk) equipped with the memory device 1120 and the controller 1110. For example, when the memory system 1100 is an SSD, the memory controller 1110 may communicate with the outside (e.g., host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), or an integrated drive electronics (IDE).

Figure 6:
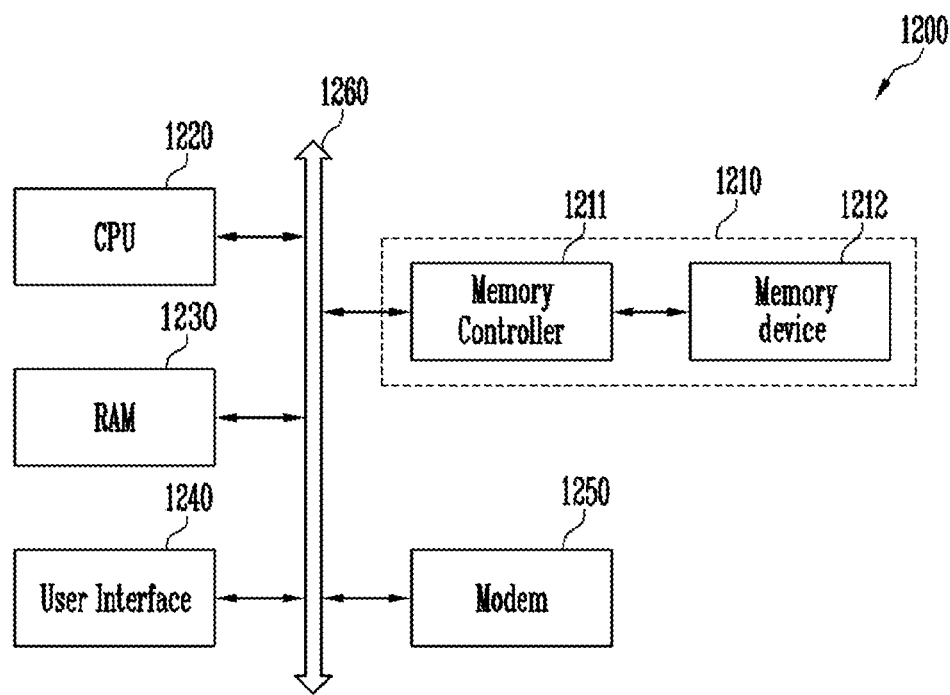
FIG. 6 is a block diagram illustrating the configuration of a computing system in accordance with an embodiment of the present disclosure.

FIG. 6 is a block diagram illustrating the configuration of a computing system in accordance with an embodiment of the present disclosure.

Referring to FIG. 6, the computing system 1200 in accordance with an embodiment of the present disclosure may include a CPU 1220, a random access memory (RAM) 1230, a user interface 1240, a modem 1250, and a memory system 1210 which are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 5, the memory system 1210 may be configured with the memory device 1212 and the memory controller 1211.

The present disclosure may improve charge retention characteristics, thus making it possible to enhance the reliability of the semiconductor device.

In an embodiment according to the present disclosure, the semiconductor device may be designed such that space in a channel hole having a limited critical dimension is efficiently used, and a tunnel insulating layer and a data storage layer have relatively large thicknesses without requiring a reduction in thickness of conductive patterns.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a tunnel insulating layer configured to enclose a channel layer;
   interlayer insulating layers stacked and configured to enclose the tunnel insulating layer;
   data storage layers disposed in respective spaces between the interlayer insulating layers and configured to enclose the tunnel insulating layer, each of the data storage layers being disposed in one side of the corresponding space adjacent to the tunnel insulating layer; and
   conductive patterns surrounding the tunnel insulating layer with the data storage layers interposed therebetween and filling the spaces,
   wherein the tunnel insulating layer has a first portion extending from each of the data storage layers to the channel layer in a first direction and a second portion extending from each of the interlayer insulating layers to the channel layer in the first direction, and
   wherein the first portion is thinner than the second portion in the first direction.

2. The semiconductor device according to claim 1, wherein the data storage layers protrude further toward the tunnel insulating layer than the interlayer insulating layers.

3. The semiconductor device according to claim 1, wherein the tunnel insulating layer includes depressions which are concave toward the channel layer.

4. The semiconductor device according to claim 1, wherein each of the data storage layers is thicker than the channel layer.

5. The semiconductor device according to claim 1, wherein the tunnel insulating layer is thicker than the channel layer.

6. A semiconductor device comprising:
   a channel hole including a tunnel insulating layer configured to enclose a channel layer;
   interlayer insulating layers stacked and configured to enclose the tunnel insulating layer;
   data storage layers disposed in respective spaces between the interlayer insulating layers and configured to enclose the tunnel insulating layer, wherein a first interface between the tunnel insulating layer and each of the data storage layers is distant from the channel layer at a smaller distance than a second interface between the tunnel insulating layer and each of the interlayer insulating layers;
   blocking insulating layers disposed on the data storage layers, respectively, wherein an end portion of each of the data storage layers is completely covered by the corresponding blocking insulating layer; and
   conductive patterns filling the spaces and disposed on the blocking insulating layers, respectively.

7. The semiconductor device according to claim 6, wherein each of the data storage layers is formed outside the channel hole.

8. The semiconductor device according to claim 6, wherein each of the data storage layers includes a region disposed outside the channel hole and a region disposed inside the channel hole.

* * * * *